United States Patent
Suematsu et al.

(10) Patent No.: US 6,329,864 B2
(45) Date of Patent: Dec. 11, 2001

(54) SEMICONDUCTOR CIRCUITRY

(75) Inventors: Noriharu Suematsu; Masayoshi Ono; Tadashi Takagi, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/790,533

(22) Filed: Feb. 23, 2001

Related U.S. Application Data

(63) Continuation of application No. PCT/JP99/03455, filed on Jun. 29, 1999.

(51) Int. Cl.[7] ........................................ G06F 7/44
(52) U.S. Cl. .......................... 327/356; 327/355; 327/359
(58) Field of Search ............................ 327/355–361, 327/427, 434, 478; 455/326

(56) References Cited

U.S. PATENT DOCUMENTS

| | | | |
|---|---|---|---|
| 5,715,532 | * 2/1998 | Sagawa et al. | 455/333 |
| 5,809,410 | * 9/1998 | Stuebing et al. | 455/326 |
| 6,104,068 | * 8/2000 | Forbes | 257/365 |
| 6,191,638 | * 2/2001 | Kamase | 327/359 |
| 6,239,645 | * 5/2001 | Tsukahara et al. | 327/359 |

FOREIGN PATENT DOCUMENTS

| | | |
|---|---|---|
| 09-069730 | 3/1997 | (JP) . |
| 09-121124 | 5/1997 | (JP) . |
| 10-209901 | 8/1998 | (JP) . |
| 10-224152 | 8/1998 | (JP) . |

OTHER PUBLICATIONS

"IEEE Journal of Solid–State Circuits" vol. 33, No. 12, Dec. 1998, p. 2240–2246.

* cited by examiner

*Primary Examiner*—Toan Tran
(74) *Attorney, Agent, or Firm*—Oblon, Spivak, McClelland, Maier & Neustadt, P.C.

(57) ABSTRACT

Semiconductor circuitry comprises a transistor pair (11, 12) consists of a transistor having a base electrode to which a first signal is applied, and another transistor having a base electrode to which a signal having a phase opposite to that of the first signal is applied, the collector electrodes of those transistors being connected to each other and the emitter electrodes of the transistors being connected to each other, a third transistor (13) connected between a common emitter of the transistor pair and a ground potential and having a base electrode to which a second signal is applied, an output load (51) connected between a common collector of the transistor pair and a power supply (Vcc), and an output circuit for furnishing a third signal from the common collector of the transistor pair, thereby suppressing generation of any even-order higher harmonic of a local oscillation signal when the semiconductor circuitry operates from a low voltage.

5 Claims, 6 Drawing Sheets

SEMICONDUCTOR CIRCUITRY

CROSS-REFERENCE TO THE RELATED APPLICATION

This application is a continuation of International Application No. PCT/JP99/03455, whose international filing date is Jun. 29, 1999, the disclosures of which Application are incorporated by reference herein, and which international application was not published in English.

BACKGROUND OF THE INVENTION

1. Field of the Invention

The present invention relates to semiconductor circuitry. More particularly, it relates to a frequency multiplier provided with transistors for multiplying the frequencies of signals of a high-frequency such as a UHF signal, a micro wave signal, and a millimeter wave signal by fixed integer values, respectively, and also relates to a harmonic mixer provided with transistors for mixing these high-frequency signals.

2. Description of the Prior Art

FIG. 6 is a circuit diagram of semiconductor circuitry which constitutes a prior art harmonic mixer as disclosed in IEEE Journal of Solid-State Circuits Vol. 33, No. 12, December, 1998, pp. 2241, for example. In the figure, reference numeral 1 denotes a power supply terminal, numeral 2a denotes a radio-frequency signal input terminal (i.e., RF input terminal), numeral 3a denotes a local oscillation input terminal (i.e., LO input terminal), numerals 4a and 4b denote output terminals, numerals 11 and 12 denote transistors, numeral 31 denotes a constant current source, and numerals 51 and 52 denote resistors.

The operation of the prior art semiconductor circuitry will be explained. A DC voltage Vcc is applied to the power supply terminal 1 of the semiconductor circuitry. A radio-frequency signal (i.e., RF signal) input from the RF input terminal 2a is applied to the base electrode of the transistor 11, and is amplified by the transistor 11. On the other hand, a local oscillation signal (i.e., LO signal) applied to the LO input terminal 3a is input to the base electrode of the transistor 12, and is amplified by the transistor 12.

The constant current source 31 is connected to the emitter electrodes of the transistors 11 and 12. Thus, an electric current having a phase opposite to and an amplitude equal to those of an electric current flowing through the transistor 11 will flow through the transistor 12. Therefore, in the transistor 11 the RF signal of positive phase is mixed with the LO signal of negative phase and they are amplified, and in the transistor 12 the RF signal of negative phase is mixed with the LO signal of positive phase and they are amplified.

As a result, the RF signal of positive phase, the LO signal of negative phase, and mixture waves of the RF signal and the LO signal are output as a collector output of the transistor 11 by way of the output terminal 4a connected to the power supply terminal 1 via the resistor 51. Furthermore, the RF signal of negative phase, the LO signal of positive phase, and mixture waves of the RF signal and the LO signal are output as a collector output of the transistor 12 by way of the output terminal 4b connected to the power supply terminal 1 via the resistor 52.

The output signal of the semiconductor circuitry is defined as a differential signal that appears between the output terminals 4a and 4b. Thus, any (2n−1)th (n is an integer of 1 or more) harmonic having a frequency (2n−1) times as large as that of the RF signal or the LO signal has a voltage two times as large as that of the RF signal or the LO signal while any (2n)th harmonic having a frequency 2n times as large as that of the RF signal or the LO signal is suppressed and is therefore not output.

When any mixture wave of the RF signal and the LO signal is not considered, odd-order higher harmonics of these signals can appear between the output terminals 4a and 4b. The semiconductor circuitry thus operates as a frequency multiplier for generating odd-order higher harmonics.

For the mixture of the RF signal and the LO signal, any even-order higher harmonic of the mixture which is an output signal of a usual fundamental harmonic mixer (e.g., a mixture wave of $f_{RF}-f_{LO}$, where $f_{RF}$ is the frequency of the RF signal and $f_{LO}$ is the frequency of the LO signal) is suppressed, and only odd-order higher harmonic of the mixture (e.g., a mixture wave of $f_{RF}-2f_{LO}$) appear between the output terminals 4a and 4b. The prior art semiconductor circuitry can thus operate as a harmonic mixer for generating odd-order higher harmonics.

If the constant current source 31 operates ideally, neither even-order higher harmonics of the RF signal and the LO signal nor even-order higher harmonics of the mixture of them appear between the output terminal 4a and 4b. However, when the power supply voltage Vcc from which the semiconductor circuitry operates is as low as about 3 volts, the constant current source 31 cannot be manufactured as an ideal element because the power supply voltage is low. Therefore, the constant current source 31 is often replaced by a resistor of about hundreds of ohms, for example.

When the constant current source 31 does not function properly, no signal of negative phase can be generated sufficiently in each of the transistors 11 and 12. Therefore, a problem with the prior art semiconductor circuitry is that there causes an unbalance between components of either the LO signal or the RF signal at the output terminal 4a and those at the other output terminal 4b, and therefore the signal level of any odd-order higher harmonic falls, and the suppression of either any even-order higher harmonic or any mixture wave signal becomes difficult and some even-order higher harmonic signal components therefore appear between the output terminals 4a and 4b.

To enable the semiconductor circuitry to operate from a lower voltage, there is provided a method for combining the RF signal of positive phase with the LO signal of negative phase, applying the composite wave to the RF input terminal 2a, combining the RF signal of negative phase with the LO signal of positive phase, and applying the composite wave to the LO input terminal 3a, without the constant current source. In this case, the semiconductor circuitry can operate from a lower voltage because it does not include the constant current source. However, since the input signal terminals for the LO signal and the RF signal are not separated, there is a need to provide circuits each for combining the RF signal with the LO signal wave while making them be out of phase by a constant phase. It is difficult to implement such the circuits as low-loss components included in the semiconductor circuitry, and it is therefore necessary to implement the circuits as external circuits other than components included in the semiconductor circuitry.

The above-mentioned description is directed to the case where the semiconductor circuitry operates as a down-converter. If the RF input terminal is replaced by an IF input terminal, the above-mentioned semiconductor circuitry can operate as an up-converter and output an RF signal. In this case, the output RF signal can be an odd-order harmonic of the mixture of an IF signal and an LO signal (e.g., a harmonic of $f_{IF}+2f_{LO}$, where $f_{IF}$ is the frequency of the IF signal).

As can be understood from the above-mentioned explanation, the prior art semiconductor circuitry in which the input terminals for the RF signal and the LO signal are separately provided can suppress any even-order harmonic to be generated between the output terminals by using the constant current source connected to the emitter electrodes of the transistors that accept the RF signal and the LO signal, respectively, and can perform a mixing of odd-order higher harmonics. Therefore, a problem with the prior art semiconductor circuitry is that it is difficult to make the constant current source operate ideally when the DC voltage Vcc applied to the semiconductor circuitry is as low as 3 Volts or less. And, another problem is that when the characteristics of the constant current source are not ideal, either any even-order higher harmonic or any mixture wave signal, particularly any even-order higher harmonic of the local oscillation signal with a large power level easily appears between the output terminals.

SUMMARY OF THE INVENTION

The present invention is proposed to solve the above-mentioned problems and it is therefore an object of the present invention to provide semiconductor circuitry capable of multiplying the frequency of a higher harmonic or mixing higher harmonics even if the semiconductor circuitry operates from a low voltage. It is a further object of the present invention to provide semiconductor circuitry that can hardly generate even-order higher harmonics of a local oscillation signal even if the semiconductor circuitry operates from a low voltage.

In accordance with an aspect of the present invention, semiconductor circuitry comprises a transistor pair that consists of a transistor having a base electrode to which a first signal is applied, and another transistor having a base electrode to which a signal having a phase opposite to that of the first signal is applied, the emitter electrodes of the transistors being connected to each other and the collector electrodes of the transistors being connected to each other, a further transistor connected between a common emitter of the transistor pair and a first fixed voltage level and having a base electrode to which a second signal is applied, an output load connected between a common collector of the transistor pair and a second fixed voltage level, and an output circuit for furnishing a third signal from the common collector of the transistor pair.

In accordance with another aspect of the present invention, the semiconductor circuitry can include two semiconductor circuits according to the first aspect of the present invention. In this case, the second signal of positive phase is applied to one of the two semiconductor circuits while the second signal of negative phase is applied to the other one of them. The former semiconductor circuit outputs the third signal of positive phase while the latter semiconductor circuit outputs the third signal of negative phase.

The above-mentioned transistors can be FETs. In this case, the base electrode, emitter electrode, and collector electrode of each transistor correspond to a gate electrode, a source electrode, and a drain electrode of a corresponding FET, respectively. The emitter or source electrode of the transistor that accepts the second signal is directly connected to the first fixed voltage level, or is alternatively connected to the first fixed voltage level by way of another circuit element.

DETAILED DESCRIPTION OF THE PREFERRED EMBODIMENTS

Embodiment 1

Figure 1:
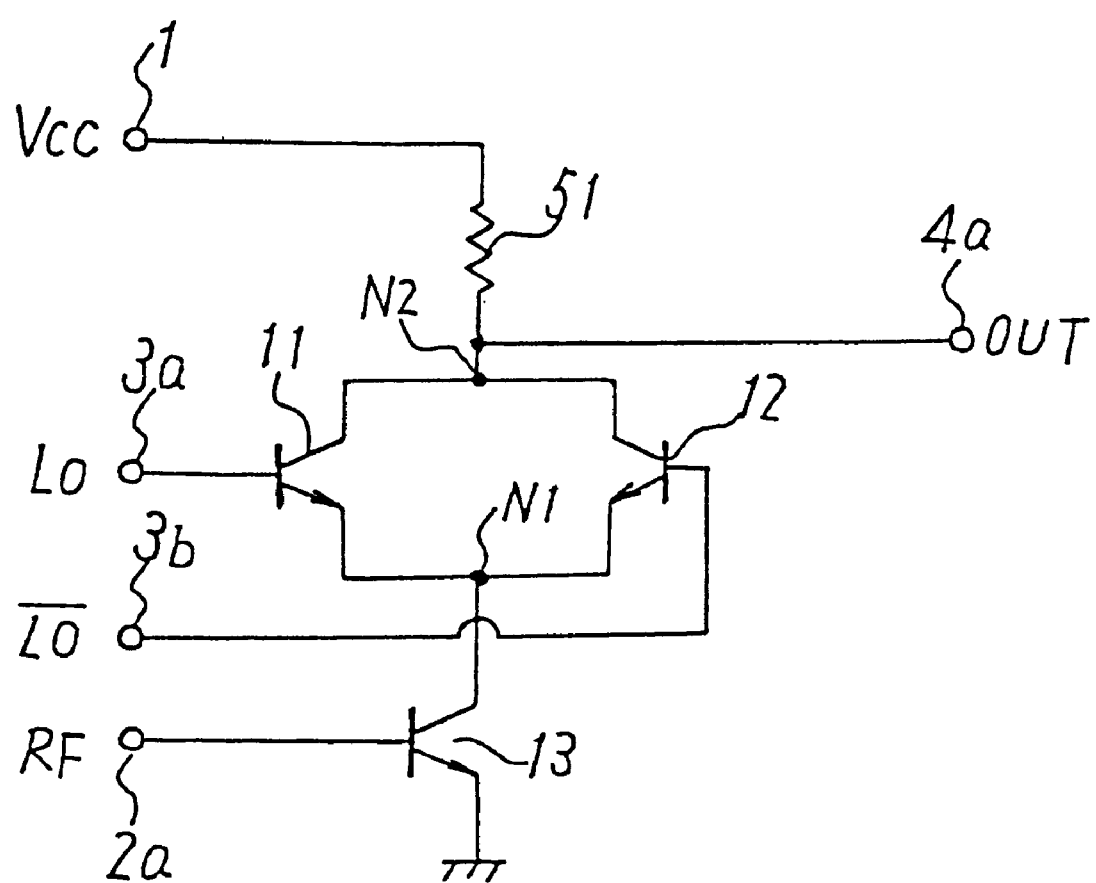
FIG. 1 is a circuit diagram showing the structure of semiconductor circuitry according to a first embodiment of the present invention.

FIG. 1 is a circuit diagram showing the structure of semiconductor circuitry according to a first embodiment of the present invention. In the figure, reference numeral 1 denotes a power supply terminal, numeral 2a denotes a radio-frequency signal input terminal (RF input terminal), numeral 3a denotes a local oscillation input terminal (LO input terminal), numeral 4a denotes an output terminal, numerals 11 to 13 denote transistors, and numeral 51 denotes a resistor.

The transistors 11 and 12 constitute a transistor pair having a common emitter N1 including the emitter electrodes of the transistors connected to each other and a common collector N2 including the collector electrodes of the transistors connected to each other. The common emitter N1 is connected to the collector electrode of the other transistor 13 having an emitter electrode grounded, and the common collector N2 is connected to the output terminal 4a, and is also connected to the power supply terminal 1 by way of the resistor 51 disposed as an output load. Therefore, a DC voltage (Vcc) applied to the power supply terminal 1 is supplied to each of the transistors 11 to 13 by way of the resistor 51. Furthermore, the RF input terminal 2a is connected to the base electrode of the transistor 13, and the LO input terminals 3a and 3b are connected to the base electrodes of the transistors 11 and 12, respectively.

A description will be made as to the operation of the semiconductor circuitry of the first embodiment. An RF signal applied to the RF input terminal 2a is input to the base electrode of the transistor 13 and is amplified by the transistor 13. Furthermore, an LO signal of positive phase applied to the LO input terminal 3a is input to the base electrode of the transistor 11 and is amplified by the transistor 11, and the LO signal of negative phase applied to the LO input terminal 3b is input to the base electrode of the transistor 12 and is amplified by the transistor 12. The other transistor 13 that amplifies the RF signal is connected to the emitter electrodes of the transistors 11 and 12. Therefore, mixture waves of the LO signal of positive phase and the RF signal of positive phase and higher harmonics of the LO signal of positive phase appear at the collector electrode of the transistor 11. Furthermore, mixture waves of the LO signal of negative phase and the RF signal of negative phase and higher harmonics of the LO signal of negative phase appear at the collector electrode of the transistor 12.

Any pair of mixture waves (e.g., a pair of mixture waves having a frequency of $f_{RF}-f_{LO}$) respectively generated by the transistors 11 and 12 with a fundamental harmonic mixing has mixtures waves which are 180° out of phase with each other at the output terminal 4a. Therefore, such pairs of mixture waves are counterbalanced and hence are not output via the output terminal 4a. Furthermore, no even-order higher harmonic of the LO signal (whose frequency is $2nf_{LO}$, where n is an integer of 1 or more) is output and no mixture wave of an odd-order higher harmonic of the LO signal and a higher harmonic of the RF signal (whose frequency is $(2n-1)f_{LO} \pm mf_{RF}$, where m is an integer of 1 or more) is output because any pair of even-order higher harmonics of the LO signal generated by the transistors 11 and 12 has even-order higher harmonics which are 180° out of phase with each other and any pair of mixture waves of an odd-order higher harmonic of the LO signal and a higher harmonic of the RF signal generated by the transistors 11 and 12 has mixture waves which are 180° out of phase with each other. As a result, only higher harmonics of frequencies $mf_{RF}$ of the RF signal, odd-order higher harmonics of frequencies $(2n-1)f_{LO}$ of the LO signal, and mixture waves of frequencies $(2nf_{LO} \pm mf_{RF})$ of an even-order higher harmonic of the LO signal and a higher harmonic of the RF signal, which are generated by the transistors 11 and 12, are output via the output terminal. The semiconductor circuitry of the first embodiment thus operates as a harmonic mixer.

The semiconductor mixer circuitry of the first embodiment can operate from a relatively-low voltage power supply of 3 Volts or less because the semiconductor mixer circuitry does not need any constant current source. Furthermore, although the emitter electrode of the transistor 13 is grounded, to expand the dynamic range of the RF signal it is possible to insert either a resistor or an inductor between the emitter electrode of the transistor 13 and the ground potential.

The semiconductor circuit needs two signals of positive phase and of negative phase for the LO signal. When only one of them is given to the semiconductor circuitry, a balun circuit only has to be connected to the former stage of the semiconductor mixer circuitry. For example, the two signals of positive phase and of negative phase can be generated by using such a circuit as a differential amplifier or a circuit that employs a transistor pair consists of a common base transistor and either a common emitter transistor or a common collector transistor. Therefore, in accordance with the first embodiment, there is provided semiconductor mixer circuitry that can operate from a relatively-low voltage which is about 2 to 3 Volts.

The above-mentioned description is directed to the case where the semiconductor circuitry of the first embodiment operates as a down-converter. If the RF input terminal is replaced by an IF input terminal, the above-mentioned semiconductor circuitry can operate as an up-converter and output an RF signal. In this case, the output RF signal can be a mixture wave of an even-order higher harmonic of an LO signal and a higher harmonic of an IF signal (whose frequency is $2nf_{LO} \pm mf_{IF}$).

When the semiconductor circuitry is used as either an up-converter or a down-converter, the LO signal input to the LO input terminals 3a and 3b has to satisfy the following given condition: $f_{RF} = 2nf_{LO}$.

Although the above description is directed to the case where the semiconductor circuitry operates as a mixer circuit, the semiconductor circuit can be made to operate as a frequency multiplier. For example, when a signal of positive phase is input to the input terminal 3a and the signal of negative phase is input to the other input terminal 3b, an odd-order higher harmonic of the input signal is output via the output terminal 4a. At this time, a DC signal is input to the input terminal 2a. As an alternative, it is possible to apply a signal other than the DC signal to the input terminal 2a by disposing a circuit that performs impedance matching only to a desired multiplication wave generated from the input signal at the output of the semiconductor circuitry.

Figure 2:
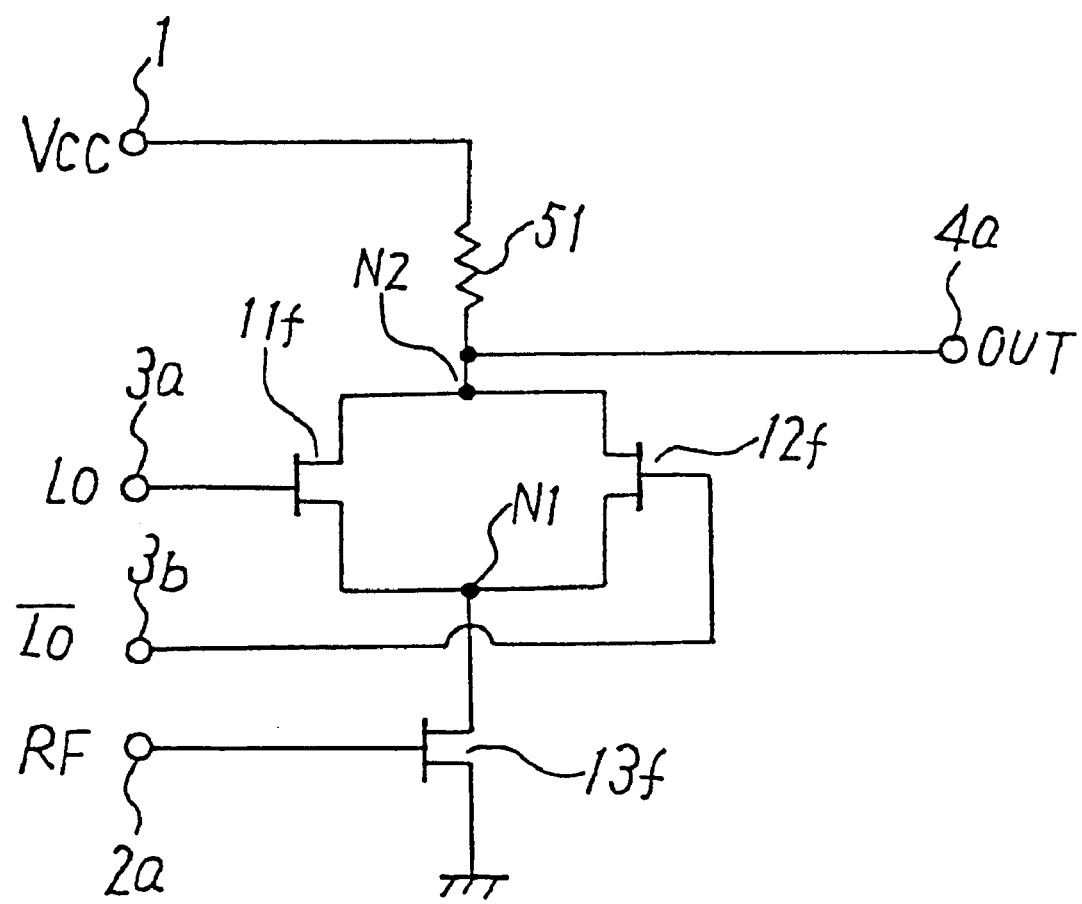
FIG. 2 is a circuit diagram showing the structure of semiconductor circuitry according to a variant of the first embodiment.

The above description of the semiconductor circuitry of the first embodiment is directed to the case where junction bipolar transistors are used as the transistors 11 to 13. As an alternative, FETs can be used as the transistors 11 to 13. FIG. 2 is a circuit diagram showing a variant of the semiconductor circuitry, which is constructed by using FETs as the transistors of FIG. 1. In this case, the collector electrode, emitter electrode and base electrode of each junction bipolar transistor are replaced by a drain electrode, a source electrode and a gate electrode of a corresponding FET in the above description of the operation of the semiconductor circuit, and the same advantages are provided. The FETS used as the transistors 11 to 13 can be GaAsFETs or MOS-FETs.

Embodiment 2

Figure 3:
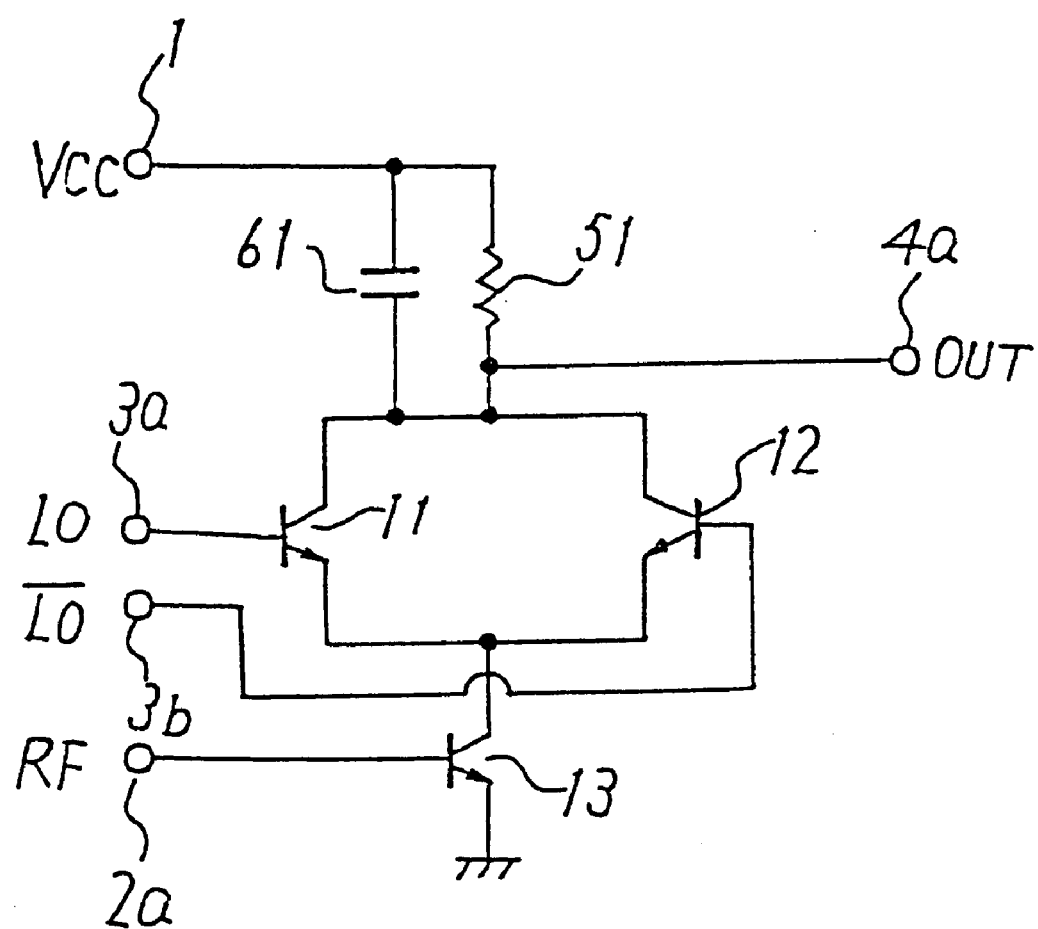
FIG. 3 is a circuit diagram showing the structure of semiconductor circuitry according to a second embodiment of the present invention.

FIG. 3 is a circuit diagram showing the structure of semiconductor circuitry according to a second embodiment of the present invention. In the figure, reference numeral 61 denotes a capacitor. Compared with the semiconductor mixer circuitry of the above-mentioned first embodiment shown in FIG. 1, the semiconductor mixer circuitry according to the second embodiment differs from the semiconductor mixer circuitry of the first embodiment in that the capacitor 61 is connected in parallel to a resistor 51. The same components as shown in FIG. 1 are designated by the same reference numerals, and therefore the description of those components will be omitted hereafter.

When the semiconductor mixer circuitry is made to operate as a down-converter, if the capacitor 61 is assumed to be short-circuited for the frequencies of an RF signal and an LO signal, and to have an impedance of the order of the resistance of the resistor 51 for the frequency of an IF signal, the RF signal, the LO signal, and any odd-order higher harmonic of the LO signal are suppressed by the capacitor 61 and are therefore not output via an output terminal. Therefore, the semiconductor mixer circuitry offers an advantage in that it can suppress spurious components at the output terminal 4a, and it can therefore simplify the structure of a spurious suppression filter externally connected to the semiconductor mixer circuitry. Furthermore, since the semiconductor mixer circuitry can suppress the spurious components within the mixer circuitry, it can improve the efficiency of conversion of the input signals to a desired wave.

The above description of the semiconductor circuitry of the second embodiment is directed to the case where junction bipolar transistors are used as the transistors 11 to 13. As an alternative, FETs can be used as the transistors 11 to 13, as previously mentioned in Embodiment 1. In addition, the semiconductor circuitry of the second embodiment can be made to operate as a frequency multiplier, like that of the above-mentioned first embodiment.

Embodiment 3

Figure 4:
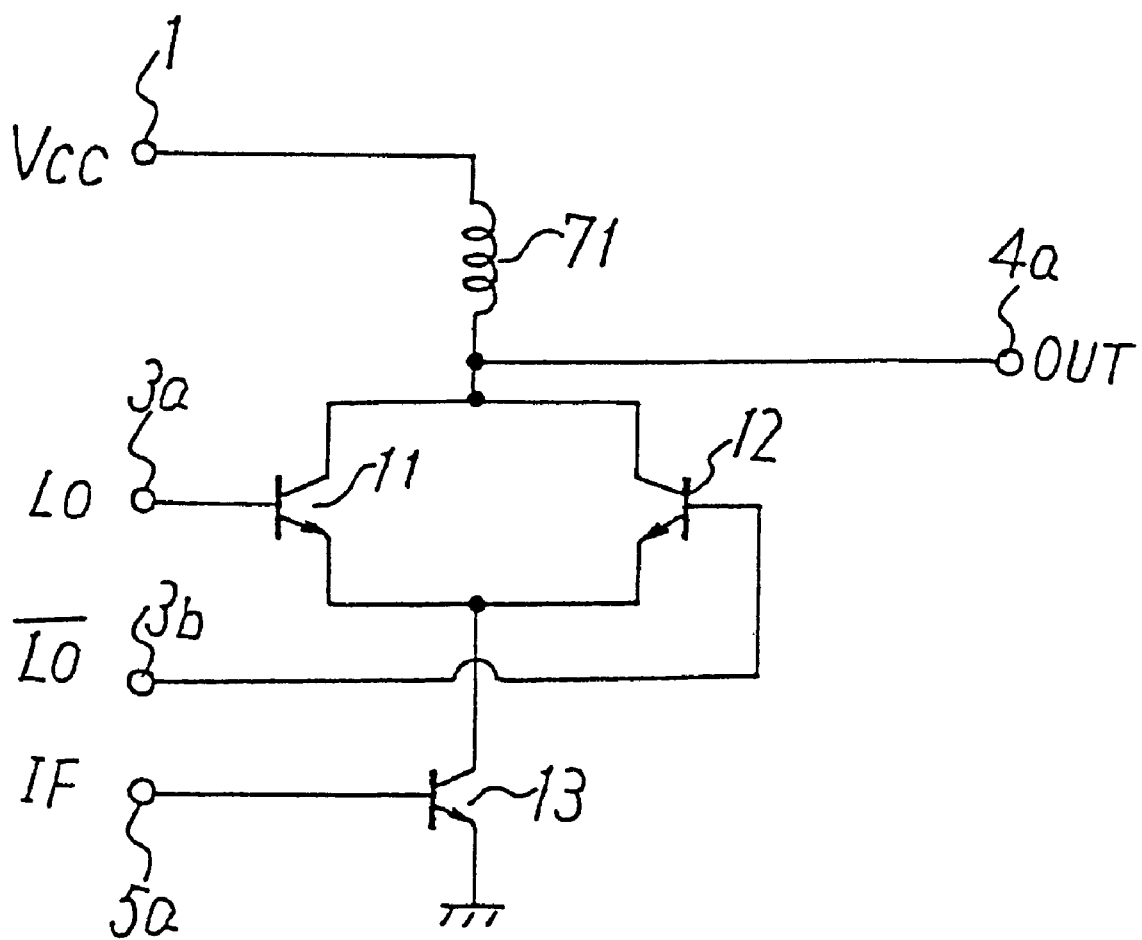
FIG. 4 is a circuit diagram showing the structure of semiconductor circuitry according to a third embodiment of the present invention.

FIG. 4 is a circuit diagram showing the structure of semiconductor circuitry according to a third embodiment of the present invention. In the figure, reference numeral 5a denotes an IF input terminal, and numeral 71 denotes an inductor. Compared with the semiconductor mixer circuitry of the above-mentioned first embodiment shown in FIG. 1, the semiconductor mixer circuitry according to the third embodiment differs from the semiconductor mixer circuitry of the above-mentioned first embodiment in that the RF input terminal 2a is replaced by the IF input terminal 5a and the resistor 51 is replaced by the inductor 71. The inductor 71 can be implemented as a spiral inductor or the like formed on the semiconductor substrate. The same components as shown in FIG. 1 are designated by the same reference numerals, and therefore the description of those components will be omitted hereafter.

When the semiconductor mixer circuitry is made to operate as a down-converter, if the inductor 71 is assumed to be short-circuited for the frequencies of an IF signal and an LO signal, and to have an impedance of the order of the resistance of the resistor 51 as shown in FIG. 1 for the frequency (e.g., $f_{IF}+2f_{LO}$) of an RF signal, the IF signal and the LO signal are suppressed by the inductor 71 and are therefore not output via an output terminal. Therefore, the semiconductor mixer circuitry offers an advantage in that it can suppress spurious components at the output terminal 4a, and it can therefore simplify the structure of a spurious suppression filter externally connected to the semiconductor mixer circuitry. Furthermore, since the semiconductor mixer circuitry can suppress the spurious components within the mixer circuitry, it can improve the efficiency of conversion of the input signals to a desired wave. In addition, since the voltage drop caused by the resistor 51 is eliminated by using the inductor in place of the resistor, it is possible to make the semiconductor circuitry operate from a lower voltage compared with those of the first and second embodiments.

The above description of the semiconductor circuitry of the third embodiment is directed to the case where junction bipolar transistors are used as the transistors 11 to 13. As an alternative, FETs can be used as the transistors 11 to 13, as previously mentioned in Embodiment 1. The semiconductor circuitry of the third embodiment can be made to operate as a frequency multiplier, like that of the above-mentioned first embodiment.

Embodiment 4

Figure 5:
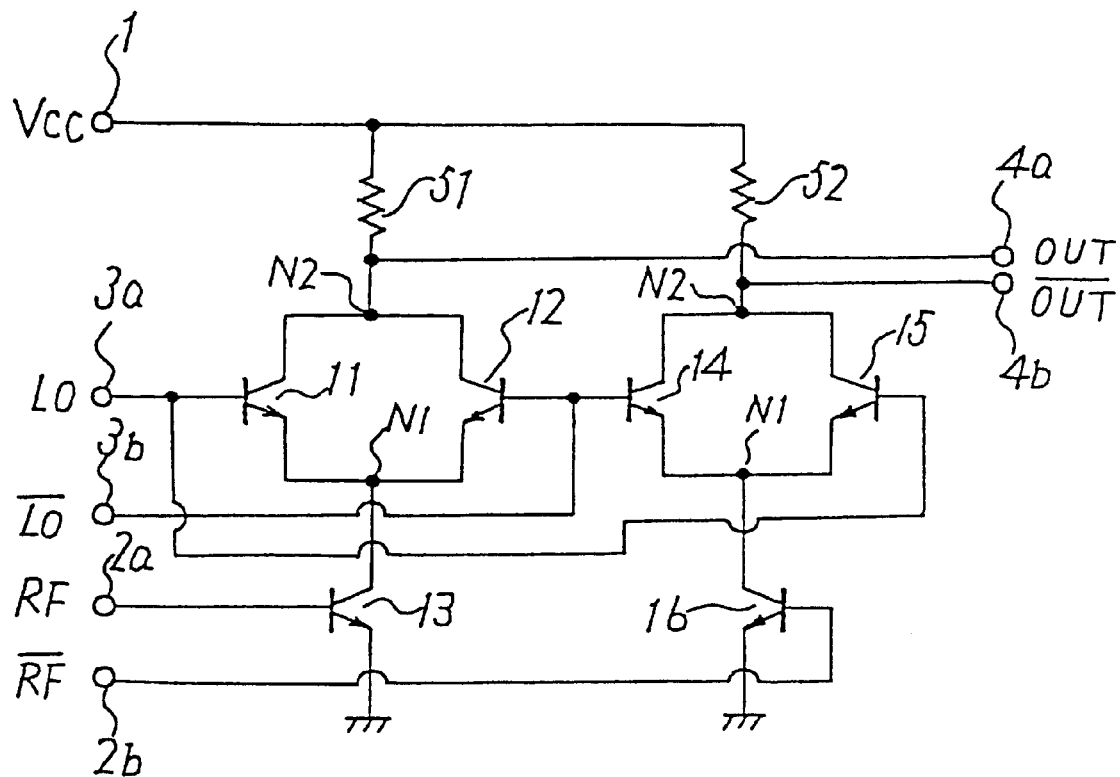
FIG. 5 is a circuit diagram showing the structure of semiconductor circuitry according to a fourth embodiment of the present invention.
Figure 6:
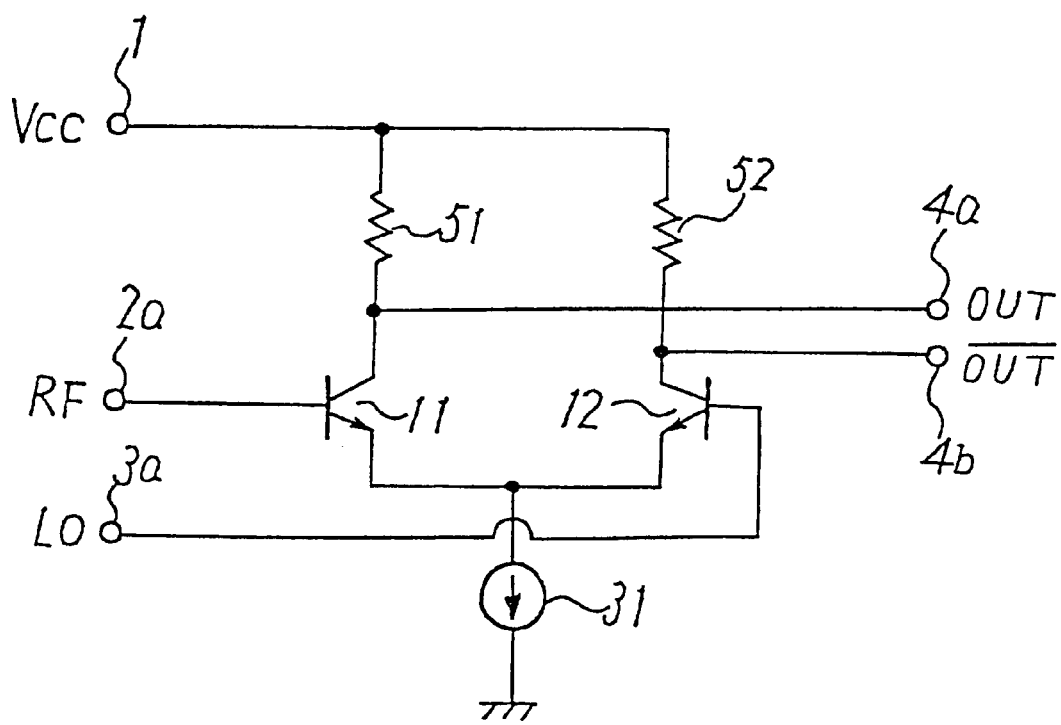
FIG. 6 is a circuit diagram showing the structure of a prior art harmonic mixer circuit.

FIG. 5 is a circuit diagram showing the structure of semiconductor circuitry according to a fourth embodiment of the present invention. In the figure, reference numeral 2b denotes an RF input terminal for accepting an RF signal of negative phase, 4b denotes an output terminal that pairs up with an output terminal 4a, for outputting a differential signal, numerals 14 to 16 denote transistors, and numeral 52 denotes a resistor. The same components as shown in FIG. 1 are designated by the same reference numerals, and therefore the description of those components will be omitted hereafter.

The semiconductor mixer circuitry of the fourth embodiment has two semiconductor mixer circuits of FIG. 1 in parallel. The first semiconductor mixer circuit is constructed of a first transistor pair consists of transistors 11 and 12, a transistor 13, and a resistor 51. In the same way, the second semiconductor mixer circuit is constructed of a second transistor pair consists of the transistors 14 and 15, the transistor 16, and the resistor 52.

A signal having a phase opposite to that of an LO signal applied to an LO input terminal 3a is input to an LO input terminal 3b. Furthermore, a signal having a phase opposite to that of an RF signal applied to an RF input terminal 2a is input to the RF input terminal 2b. And, an output signal is furnished as a differential signal that appear between the output terminal 4a of the first semiconductor mixer circuit and the output terminal 4b of the second semiconductor mixer circuit.

Compared with the semiconductor mixer circuitry of the above-mentioned first embodiment, the semiconductor mixer circuitry of the fourth embodiment having such a balance type structure can suppress any odd-order higher harmonic of the RF signal and any mixture wave of an even-order higher harmonic of the LO signal and an even-order higher harmonic of the RF signal, which are furnished to the output terminals. Therefore, the semiconductor mixer circuitry can easily output a mixture wave of a second harmonic of the LO signal and a first harmonic of the RF signal, which is the most general output signal from a general harmonic mixer. The semiconductor mixer circuitry thus offers an advantage in that since it can suppress many spurious components, it can therefore simplify the structure of a spurious suppression filter connected to the output terminals of the semiconductor mixer circuitry.

The above-mentioned description is directed to the case where the semiconductor circuitry of the fourth embodiment operates as a down-converter. If the RF input terminals is replaced by IF input terminals, the above-mentioned semiconductor circuitry can be made to operate as an up-converter and output an RF signal. In this case, the output RF signal can be a mixture wave of an even-order harmonic of the LO signal and an IF signal.

The above description of the semiconductor circuitry of the fourth embodiment is directed to the case where junction bipolar transistors are used as the transistors 11 to 13. As an alternative, FETs can be used as the transistors 11 to 13, as previously mentioned in Embodiment 1. In this case, the collector electrode, emitter electrode and base electrode of each junction bipolar transistor are replaced by a drain electrode, a source electrode and a gate electrode of a corresponding FET in the above description of the operation of the semiconductor circuit, and the same advantages are provided. Furthermore, the semiconductor circuitry of the fourth embodiment can be made to operate as a frequency multiplier, like that of the above-mentioned first embodiment.

Furthermore, although the above description is directed to the case where two semiconductor mixer circuits of FIG. 1 are connected in parallel to each other and hence constitutes balance type semiconductor circuitry, the semiconductor circuitry of the fourth embodiment can be alternatively constructed of two semiconductor mixer circuits of FIG. 2 or 3 connected in parallel to each other. This variant offers the same advantages.

What is claimed is:

1. Semiconductor circuitry comprising:
    a transistor pair that consists of a first transistor having a base electrode to which a first signal is applied, and a second transistor having a base electrode to which a signal having a phase opposite to that of the first signal is applied, emitter electrodes of said first and second transistors being connected to each other and collector electrodes of said first and second transistors being connected to each other;
    a third transistor having a base electrode to which a second signal is applied, an emitter electrode connected to a first fixed voltage level, and a collector electrode connected to a common emitter of said transistor pair; and
    an output circuit for connecting a common collector of said transistor pair to a second fixed voltage level by way of an output load, and for furnishing a third signal from the common collector of said transistor pair.

2. The semiconductor mixer circuitry according to claim 1, wherein said output load consists of a resistor and a capacitor in parallel.

3. The semiconductor mixer circuit according to claim 1, wherein said output load consists of an inductor.

4. Semiconductor circuitry comprising:
    a first transistor pair that consists of a first transistor having a base electrode to which a first signal is applied, and a second transistor having a base electrode to which a signal having a phase opposite to that of the first signal is applied, emitter electrodes of said first and second transistors being connected to each other and collector electrodes of said first and second transistors being connected to each other;

a third transistor having a base electrode to which a second signal is applied, an emitter electrode connected to a first fixed voltage level, and a collector electrode connected to a common emitter of said first transistor pair;

a first output circuit for connecting a common collector of said first transistor pair to a second fixed voltage level by way of an output load, and for furnishing a third signal from the common collector of said first transistor pair;

a second transistor pair that consists of a fourth transistor having a base electrode to which the first signal is applied, and a fifth transistor having a base electrode to which the signal having a phase opposite to that of the first signal is applied, emitter electrodes of said fourth and fifth transistors being connected to each other and collector electrodes of said fourth and fifth transistors being connected to each other;

a sixth transistor having a base electrode to which the second signal is applied, an emitter electrode connected to the first fixed voltage level, and a collector electrode connected to a common emitter of said second transistor pair; and a second output circuit for connecting a common collector of said second transistor pair to the second fixed voltage level by way of an output load, and for furnishing a signal having a phase opposite to that of the third signal from the common collector of said second transistor pair.

5. Semiconductor circuitry comprising:

a transistor pair that consists of a first FET having a gate electrode to which a first signal is applied, and a second FET having a gate electrode to which a signal having a phase opposite to that of the first signal is applied, source electrodes of said first and second FETs being connected to each other and drain electrodes of said first and second FETs being connected to each other;

a third transistor having a gate electrode to which a second signal is applied, a source electrode connected to a first fixed voltage level, and a drain electrode connected to a common source of said transistor pair; and an output circuit for connecting a common drain of said transistor pair to a second fixed voltage level by way of an output load, and for furnishing a third signal from the common drain of said transistor pair.

* * * * *